(12) United States Patent
Yu et al.

(10) Patent No.: US 8,373,071 B2
(45) Date of Patent: Feb. 12, 2013

(54) EMBEDDED WIRING BOARD AND METHOD FOR MANUFACTURING THE SAME

(75) Inventors: Cheng-Po Yu, Taoyuan County (TW); Chai-Liang Hsu, Taipei County (TW)

(73) Assignee: Unimicron Technology Corp., Taoyuan (TW)

( * ) Notice: Subject to any disclaimer, the term of this patent is extended or adjusted under 35 U.S.C. 154(b) by 393 days.

(21) Appl. No.: 12/696,629

(22) Filed: Jan. 29, 2010

(65) Prior Publication Data

US 2011/0139494 A1    Jun. 16, 2011

(30) Foreign Application Priority Data

Dec. 10, 2009  (TW) .............................. 98142301 A

(51) Int. Cl.
*H05K 1/00*   (2006.01)
(52) U.S. Cl. ...................................... 174/258; 174/262
(58) Field of Classification Search .................. 174/255, 174/258, 262–266; 361/792–795
See application file for complete search history.

(56) References Cited

U.S. PATENT DOCUMENTS 6,784,376 B1 *  8/2004  Huemoeller et al. ......... 174/262

\* cited by examiner

*Primary Examiner* — Jeremy Norris
(74) *Attorney, Agent, or Firm* — Li & Cai Intellectual Property (USA) Office

(57) ABSTRACT

A method for manufacturing an embedded wiring board is provided. An activating insulation layer is formed, in which the activating insulation layer includes a plurality of catalyst particles, and covers a first wiring layer. An intaglio pattern and at least one blind via partially exposing the first wiring layer are formed on the activating insulation layer, in which some of the catalyst particles are activated and exposed in the intaglio pattern and the blind via. The activating insulation layer is dipped in a first chemical plating solution, and a solid conductive pillar is formed in the blind via through electroless plating. The activating insulation layer is dipped in a second chemical plating solution after the solid conductive pillar is formed, and a second wiring layer is formed in the intaglio pattern through the electroless plating. Components of the first chemical plating solution and the second chemical plating solution are different.

11 Claims, 8 Drawing Sheets

EMBEDDED WIRING BOARD AND METHOD FOR MANUFACTURING THE SAME

CROSS-REFERENCE TO RELATED APPLICATION

This application claims the benefit of Taiwan Patent Application No. 098142301, filed on Dec. 10, 2009, which is hereby incorporated by reference for all purposes as if fully set forth herein.

BACKGROUND OF THE INVENTION

1. Field of the Invention

The present invention relates to a wiring board and a method for manufacturing the same, and more particularly to an embedded wiring board and a method for manufacturing the same.

2. Related Art

In the current wiring board technology, an embedded wiring board is developed, in which a wiring on a surface thereof is buried in a dielectric layer instead of protruding from a surface of the dielectric layer.

FIG. 1 is a cross-sectional view of a conventional embedded wiring board. Referring to FIG. 1, the conventional embedded wiring board 100 includes a dielectric layer 110, two wiring layers 120a and 120b, and a conductive pillar 130. The dielectric layer 110 has an upper surface 112 and a lower surface 114 opposite to each other, a blind via T1, and a recess S1 on the upper surface 112, and the wiring layers 120a and 120b are respectively buried in the upper surface 112 and the lower surface 114.

The wiring layer 120a includes at least one pad 122a and a plurality of traces 124a, and the wiring layer 120b includes at least one pad 122b and a plurality of traces 124b. The pad 122a is disposed in the recess S1, and the conductive pillar 130 is disposed in the blind via T1 and is connected between the pad 122a and the pad 122b. As such, the wiring layers 120a and 120b are electrically connected to each other.

The pad 122a and the conductive pillar 130 are usually formed by a metal layer 102 and a plating deposit 104, and the traces 124a are formed by a metal layer 106 and a plating deposit 108. The metal layer 102 covers all surfaces of the recess S1 and the blind via T1, and the plating deposit 104 is located on the metal layer 102. The metal layer 102 and the plating deposit 104 fill up the recess S1 and the blind via T1, so as to form the pad 122a and the conductive pillar 130.

Generally, the metal layers 102 and 106 are mostly formed through electroless plating, and the plating deposit 104 and the plating deposit 108 are usually formed through electrical plating. Particularly, no external current is applied during the process for forming the metal layers 102 and 106, and the plating deposit 104 and the plating deposit 108 are formed by applying an external current.

Accordingly, the manner of forming the metal layers 102 and 106 is different from the manner of forming the plating deposit 104 and the plating deposit 108, such that an interface F1 exists between the metal layer 102 and the plating deposit 104, and an interface F2 exists between the metal layer 106 and the plating deposit 108. After the embedded wiring board 100 is sliced, the interfaces F1 and F2 can be observed by using an optical microscope.

In order to form the metal layers 102 and 106, a seed layer (not shown in FIG. 1) is usually firstly formed on the upper surface 112 of the dielectric layer 110, in the recess S1, and in the blind via T1, and the seed layer is usually an activated palladium layer. The seed layer has an oxidation and reduction reaction with chemical solutions for forming the metal layers 102 and 106, so as to reduce metal ions in the chemical solutions, thereby forming the metal layers 102 and 106. Thus, the embedded wiring board 100 is manufactured.

SUMMARY OF THE INVENTION

The present invention is directed to a method for manufacturing an embedded wiring board, which is capable of forming at least one solid conductive pillar through electroless plating without using electrical plating.

The present invention is further directed to an embedded wiring board, which is manufactured by using the manufacturing method.

The present invention provides a method for manufacturing an embedded wiring board. Firstly, an activating insulation layer is formed, which includes a plurality of catalyst particles, and covers a first wiring layer. An intaglio pattern and at least one blind via partially exposing the first wiring layer are formed on the activating insulation layer, in which some catalyst particles are activated and exposed in the intaglio pattern and the blind via. The activating insulation layer is dipped in a first chemical plating solution, and a solid conductive pillar is formed in the blind via through electroless plating. After the solid conductive pillar is formed, the activating insulation layer is dipped in a second chemical plating solution, and a second wiring layer is formed in the intaglio pattern through the electroless plating, in which components of the first chemical plating solution and the second chemical plating solution are different.

The present invention further provides an embedded wiring board, which includes an activating insulation layer, a first wiring layer, a second wiring layer, and a solid conductive pillar. The activating insulation layer has an upper surface and a lower surface opposite to the upper surface, and includes a plurality of catalyst particles. The first wiring layer is located on the lower surface, and includes at least one first pad buried in the lower surface. The second wiring layer is located on the upper surface, and includes at least one second pad buried in the upper surface. The solid conductive pillar is disposed in the activating insulation layer, contacts with some of the catalyst particles, and is connected between the first pad and the second pad. An upper interface plane exists between the solid conductive pillar and the second pad, and separates the solid conductive pillar and the second pad. A distance between the upper interface plane and the upper surface is not greater than a distance between the upper interface plane and the lower surface.

Based on the above, in the present invention, under a condition of not applying any external current, at least one solid conductive pillar is formed through chemical reactions by using the activating insulation layer, and the first chemical plating solution and the second chemical plating solution having the different components. Therefore, in the present invention, the solid conductive pillar is formed through the electroless plating.

The present invention is described in detail in the following with reference to the embodiments and the accompanying drawings.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
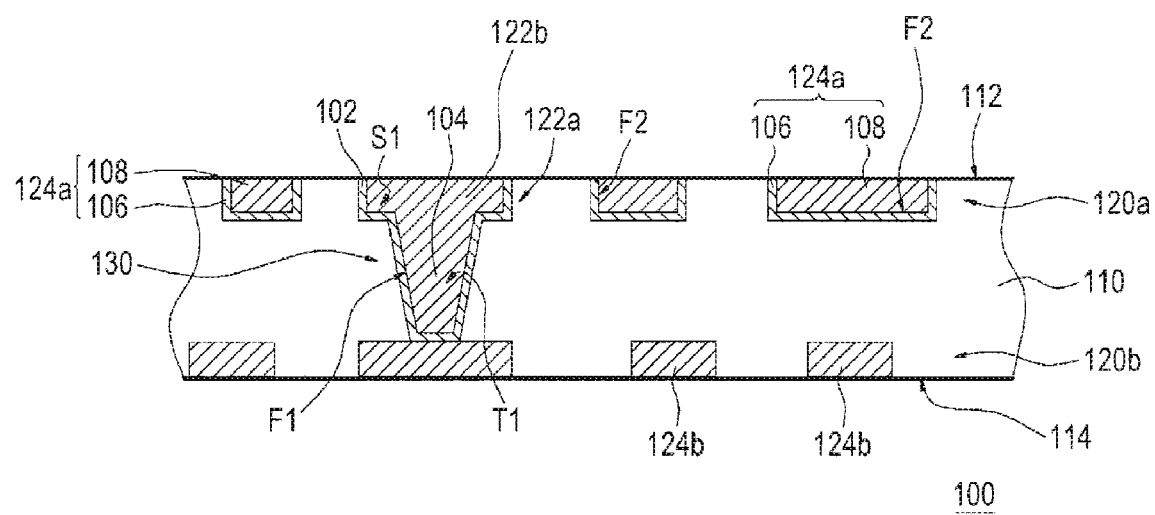
FIG. 1 is a cross-sectional view of a conventional embedded wiring board.
Figure 2A:
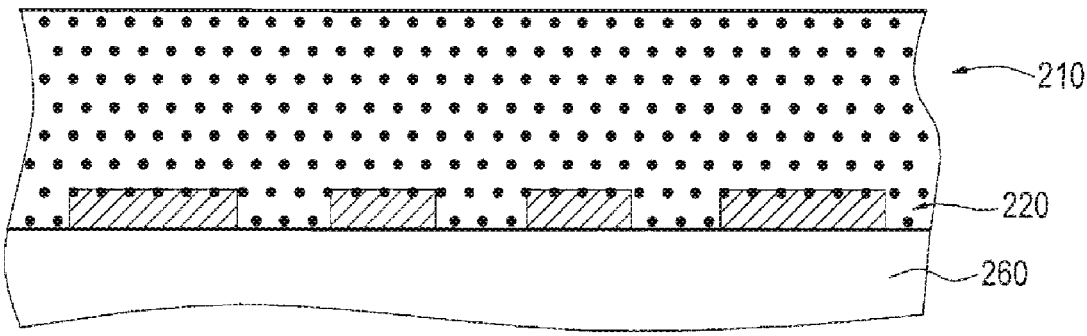
FIGS. 2A to 2D are cross-sectional views of a process of a method for manufacturing an embedded wiring board according to an embodiment of the present invention.
Figure 2B:
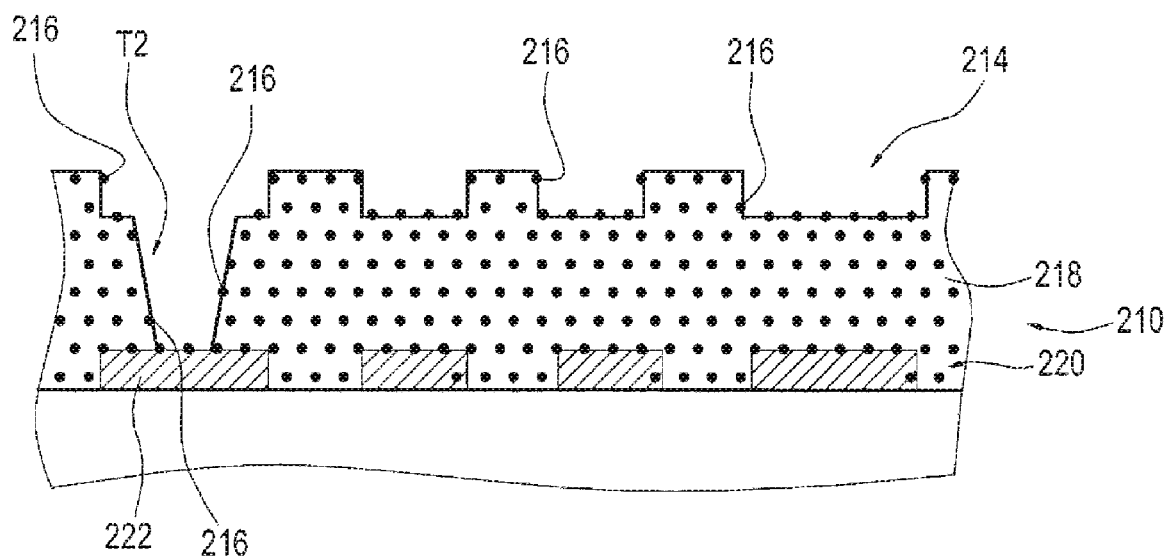
Figure 2C:
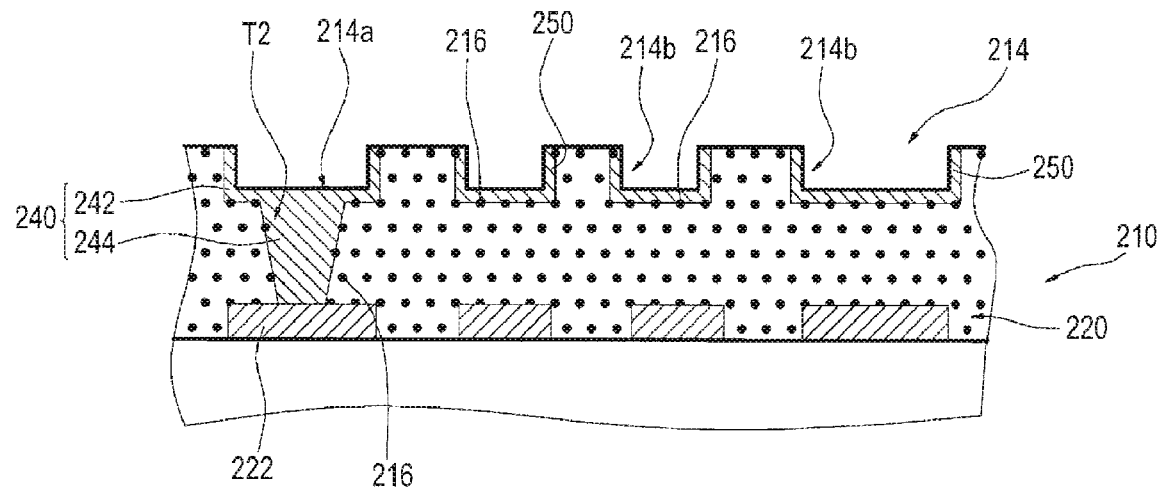
Figure 2D:
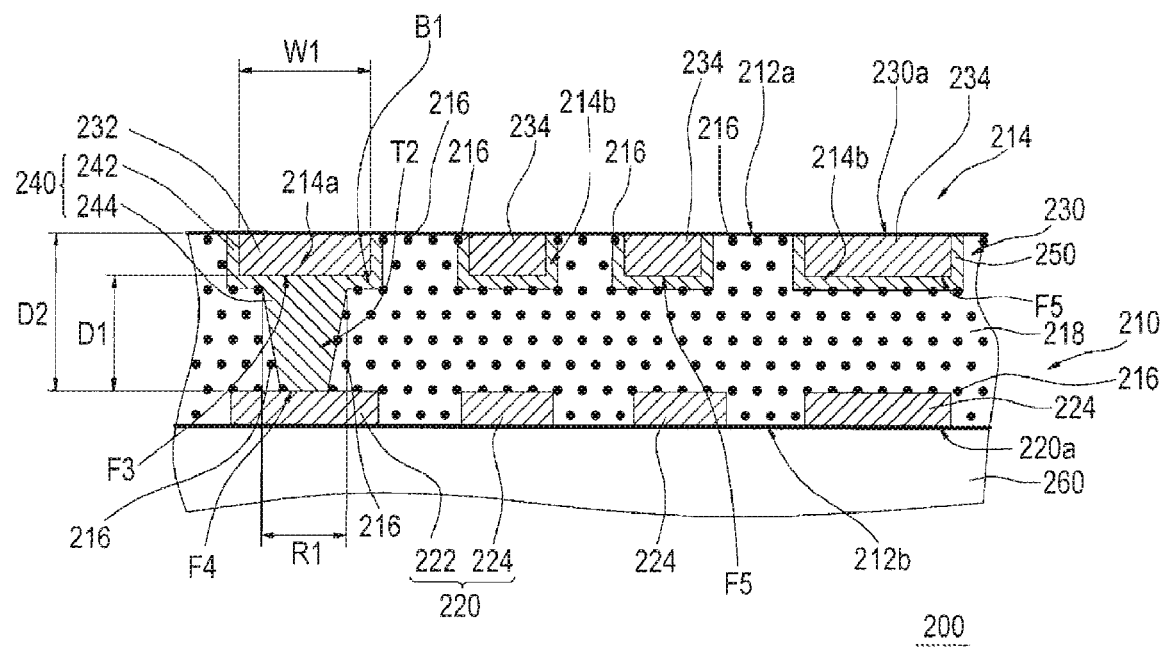

FIGS. 2A to 2D are cross-sectional views of a process of a method for manufacturing an embedded wiring board according to an embodiment of the present invention. Referring to FIG. 2D, here, firstly a structure of the embedded wiring board 200 of this embodiment is described. The embedded wiring board 200 includes an activating insulation layer 210, a first wiring layer 220, a second wiring layer 230, and at least one solid conductive pillar 240, in which the first wiring layer 220 and the second wiring layer 230 are respectively disposed on two opposite sides of the activating insulation layer 210.

Particularly, the activating insulation layer 210 has an upper surface 212a and a lower surface 212b opposite to the upper surface 212a. The first wiring layer 220 is located on the lower surface 212b, and the second wiring layer 230 is located on the upper surface 212a. The first wiring layer 220 and the second wiring layer 230 are respectively buried in the lower surface 212b and the upper surface 212a, a surface 220a of the first wiring layer 220 may be substantially aligned with the lower surface 212b, and a surface 230a of the second wiring layer 230 may be substantially aligned with the upper surface 212a.

The first wiring layer 220 includes at least one first pad 222 and a plurality of traces 224, and the first pad 222 and the traces 224 are buried in the lower surface 212b of the activating insulation layer 210. The second wiring layer 230 includes at least one second pad 232 and a plurality of traces 234, and the second pad 232 and the traces 234 are buried in the upper surface 212a of the activating insulation layer 210. The solid conductive pillar 240 is disposed in the activating insulation layer 210, and is connected between the first pad 222 and the second pad 232.

The activating insulation layer 210 has a blind via T2 and an intaglio pattern 214 located on the upper surface 212a. The intaglio pattern 214 includes at least one recess 214a and a plurality of trenches 214b, and the blind via T2 is located under the recess 214a. The solid conductive pillar 240 is disposed in the blind via T2, and the second wiring layer 230 is located in the intaglio pattern 214. The second pad 232 is located in the recess 214a, and the traces 234 are respectively located in the trenches 214b.

An upper interface plane F3 exists between the solid conductive pillar 240 and the second pad 232, and a lower interface plane F4 exists between the solid conductive pillar 240 and the first pad 222. The upper interface plane F3 separates the solid conductive pillar 240 and the second pad 232, and the lower interface plane F4 separates the solid conductive pillar 240 and the first pad 222. Therefore, the upper interface plane F3 may be considered as a boundary between the solid conductive pillar 240 and the second pad 232, and the lower interface plane F4 may be considered as a boundary between the solid conductive pillar 240 and the first pad 222. In addition, the upper interface plane F3 and the lower interface plane F4 may be observed by using an optical microscope.

A distance D1 between the upper interface plane F3 and the first wiring layer 220 is smaller than a distance D2 between the upper surface 212a and the first wiring layer 220, and a ratio of the distance D1 to the distance D2 is between 50% and 90%. In other words, compared with the lower surface 212b, the upper surface 212a is closer to the upper interface plane F3. In addition, the upper interface plane F3 is located above a bottom surface B1 of the recess 214a, and a width W1 of the upper interface plane F3 is greater than an aperture R1 of the blind via T2.

The embedded wiring board 200 further includes a plurality of metal deposition layers 250, and the metal deposition layers 250 are located in the trenches 214b of the intaglio pattern 214, and may conformally cover the trenches 214b. The second wiring layer 230 is disposed on the metal deposition layers 250, and is connected to the metal deposition layers 250, and the metal deposition layers 250, the second wiring layer 230, and the solid conductive pillar 240 fill up the intaglio pattern 214. In addition, a plurality of interfaces F5 exist between the traces 234 and the metal deposition layers 250, and the interfaces F5 may be seen by using the optical microscope.

The solid conductive pillar 240 includes a slot 242 and a solid column 244 connected to the slot 242. The slot 242 is located in the recess 214a, and the solid column 244 is located in the blind via T2. The second pad 232 is located in the slot 242, and is connected to the slot 242, and the upper interface plane F3 is located between the slot 242 and the second pad 232.

The slot 242 and the solid column 244 are integrally formed a single-body structure. Particularly, the structure of the solid conductive pillar 240 is compact, and no interface exists between the slot 242 and the solid column 244. In other words, for the structure, the slot 242 and the solid column 244 are not separated from each other, and no boundary for separating the slot 242 and the solid column 244 exists between the slot 242 and the solid column 244, as shown in FIG. 2D.

The activating insulation layer 210 includes a plurality of catalyst particles 216 and a high molecular weight compound 218, in which the catalyst particles 216 are distributed in the high molecular weight compound 218. The solid conductive pillar 240 and the metal deposition layers 250 contact with some catalyst particles 216, and the second wiring layer 230 does not contact with the catalyst particles 216. Particularly, the slot 242 of the solid conductive pillar 240 contacts with the catalyst particles 216 located in the recess 214a, the solid column 244 contacts with the catalyst particles 216 located in the blind via T2, and the metal deposition layers 250 contact with the catalyst particles 216 located in the trenches 214b.

The catalyst particles 216 may be a plurality of nanoparticles, and may have a metal component. Particularly, components of the nanoparticles include metal atoms or metal ions, and materials of the catalyst particles 216 include a metal coordination compound. The metal coordination compound is, for example, a metal oxide, a metal nitride, a metal complex, or a metal chelate, and materials of the metal coordination compound are, for example, selected from a group consisting of zinc, copper, silver, gold, nickel, aluminum, palladium, platinum, cobalt, rhodium, iridium, indium, iron, manganese, chromium, molybdenum, tungsten, vanadium, tantalum, titanium, and any combination thereof. Therefore, the catalyst particles 216 are, for example, aluminum nitride, copper oxide, titanium nitride, cobalt molybdenum bimetallic nitride ($Co_2Mo_3N_x$) particles, or palladium metal particles.

In addition, the materials of the catalyst particles 216 may include various metal coordination compounds. Particularly, the materials of the catalyst particles 216 may be selected from a group consisting of a metal oxide, a metal nitride, a metal complex, a metal chelate, and any combination thereof. For example, the catalyst particles 216 may include the metal oxide and the metal complex at the same time, or include the metal nitride, the metal complex, and the metal chelate at the same time.

Materials of the high molecular weight compound 218 are, for example, selected from a group consisting of epoxy resin, modified epoxy resin, polyester, acrylate, fluoro-polymer, polyphenylene oxide, polyamide, phenolicresin, polysulfone, silicone polymer, bismaleimide triazine modified epoxy (BT resin), cyanate ester, polyethylene, polycarbonate (PC), acrylonitrile-butadiene-styrene copolymer (ABS copolymer), polyethylene terephthalate (PET), polybutylene terephthalate (PBT), liquid crystal polymers (LCPs), polyamide 6 (PA 6), Nylon, polyoxymethylene (POM), polyphenylene sulfide (PPS), cyclic olefin copolymer (COC), and any combination thereof.

During the process for manufacturing the embedded wiring board 200, the catalyst particles 216 assist in forming the metal deposition layers 250 and the solid conductive pillar 240, and functions of the catalyst particles 216 will be described in the following.

In addition, the embedded wiring board 200 may further include an inner layer wiring substrate 260. The activating insulation layer 210 and the first wiring layer 220 are disposed on the inner layer wiring substrate 260, and the first wiring layer 220 is electrically connected to the inner layer wiring substrate 260. The inner layer wiring substrate 260 includes at least one conductive pillar (not shown), and the first wiring layer 220 is electrically connected to the inner layer wiring substrate 260 through the conductive pillar.

The inner layer wiring substrate 260 has at least one wiring layer (not shown), such that the embedded wiring board 200 includes at least three wiring layers (including the first wiring layer 220 and the second wiring layer 230). In other words, the embedded wiring board 200 may be a multilayer wiring board having at least three wiring layers.

However, in other embodiments that are not shown herein, the embedded wiring board 200 may be a double-side wiring board, and the inner layer wiring substrate 260 is not needed, that is, the embedded wiring board 200 may not include the inner layer wiring substrate 260. Therefore, the inner layer wiring substrate 260 is not a necessary element for the embedded wiring board 200, and the inner layer wiring substrate 260 shown in FIG. 2D is only used for exemplary description, but is not used to limit the present invention.

It should be noted that the conductive pillar and the wiring layer of the inner layer wiring substrate 260 are common structures of the current wiring substrate, so even the conductive pillar and the wiring layer of the inner layer wiring substrate 260 are not shown, persons of ordinary skill in the art of the wiring board technology may know the structures and the forming methods of the conductive pillar and the wiring layer of the inner layer wiring substrate 260 according to the above content and the current wiring board technology.

Only the structure of the embedded wiring board 200 is introduced in the above. Next, the method for manufacturing the embedded wiring board 200 is described in detail with reference to FIGS. 2A to 2D.

Referring to FIG. 2A, in the method for manufacturing the embedded wiring board 200, firstly, the activating insulation layer 210 is formed, and the activating insulation layer 210 covers the first wiring layer 220. Here, the activating insulation layer 210 is formed through pressing or coating. Particularly, the activating insulation layer 210 may be a liquid material or an adhesive solid film layer. When the activating insulation layer 210 is the liquid material, the activating insulation layer 210 is formed through coating. When the activating insulation layer 210 is the solid state film layer, the activating insulation layer 210 is formed through pressing.

In addition, when the embedded wiring board 200 of the multilayer wiring board type is manufactured, the activating insulation layer 210 may be formed on the inner layer wiring substrate 260, in which the first wiring layer 220 is located on the inner layer wiring substrate 260, and is electrically connected to the inner layer wiring substrate 260. When the embedded wiring board 200 of the double-side wiring board type is manufactured, it is unnecessary to form the activating insulation layer 210 on the inner layer wiring substrate 260. Therefore, the inner layer wiring substrate 260 shown in FIGS. 2A to 2D is only used for the exemplary description, but is not used to limit the present invention.

Referring to FIG. 2B, next, the intaglio pattern 214 and at least one blind via T2 are formed on the activating insulation layer 210. The blind via T2 partially exposes the first wiring layer 220, and the blind via T2 exposes the first pad 222 of the first wiring layer 220. The activating insulation layer 210 includes the high molecular weight compound 218 and the catalyst particles 216 distributed in the high molecular weight compound 218, and some catalyst particles 216 are activated and exposed in the intaglio pattern 214 and the blind via T2.

The intaglio pattern 214 and the blind via T2 are formed and the catalyst particles 216 exposed in the intaglio pattern 214 and the blind via T2 are activated through laser ablation, plasma etching, or a mechanical processing method. For a laser optical source adopted in the laser ablation, a wavelength of an emitted laser beam may be within a range of visible light, infrared light, or ultraviolet light.

Accordingly, the laser optical source adopted in the laser ablation may be an infrared laser, an ultraviolet laser, an yttrium aluminum garnet (YAG) laser, a carbon dioxide laser, an excimer laser, or a far-infrared laser. In addition, the mechanical processing method includes a water jet cutting method, a sand blasting method, or a profile cutting method, and the profile cutting method may be V-cut or routing.

During the process of the laser ablation or plasma etching, the laser beam or the plasma not only removes a part of the activating insulation layer 210 to form the intaglio pattern 214 and the blind via T2, but also breaks chemical bonds of the catalyst particles 216 exposed in the intaglio pattern 214 and the blind via T2 to activate the catalyst particles 216.

Referring to FIG. 2C, next, the activating insulation layer 210 is dipped in a first chemical plating solution (not shown), and the solid conductive pillar 240 is formed in the blind via T2 through electroless plating. The solid conductive pillar 240 fills up the blind via T2, and is connected to the first pad 222 of the first wiring layer 220. In addition, the first chemical plating solution may be a liquid including metal ions, for example, a copper sulfate solution, a copper chloride solution, a copper nitrate solution, or other copper ion solutions.

When the activating insulation layer 210 is dipped in the first chemical plating solution, the metal deposition layers 250 are formed in the intaglio pattern 214 through the electroless plating, and the metal deposition layers 250 are formed in the trenched 214b of the intaglio pattern 214. Here, the metal deposition layers 250 do not fill up the intaglio pattern 214, as shown in FIG. 2C. It may be known that during a process of forming the solid conductive pillar 240 and the metal deposition layers 250, no external current is applied.

The solid conductive pillar 240 includes the slot 242 and the solid column 244. When the activating insulation layer 210 is dipped in the first chemical plating solution, the solid column 244 is formed in the blind via T2, and the slot 242 is formed in the recess 214a of the intaglio pattern 214. Therefore, the slot 242 and the solid column 244 are formed in the same chemical plating solution (that is, the first chemical plating solution), such that the slot 242 and the solid column 244 are integrally formed as a single-body structure, and no interface exists between the slot 242 and the solid column 244.

In addition, the catalyst particles 216 exposed in the intaglio pattern 214 and the blind via T2 are activated, such that when the activating insulation layer 210 is dipped in the first chemical plating solution, the first chemical plating solution directly has a chemical reaction (for example, an oxidation and reduction reaction) with the activated catalyst particles 216, such that a metal is deposited in the intaglio pattern 214 and the blind via T2, so as to form the solid conductive pillar 240. Compared with the prior art, in this embodiment, a seed layer is not required in the intaglio pattern 214 and the blind via T2, that is, the solid conductive pillar 240 and the metal deposition layers 250 are directly formed.

Referring to FIG. 2D, after the solid conductive pillar 240 is formed, the activating insulation layer 210 is dipped in a second chemical plating solution (not shown), and the second wiring layer 230 is formed in the intaglio pattern 214 through the electroless plating. Till now, the embedded wiring board 200 is basically manufactured.

When the activating insulation layer 210 is dipped in the second chemical plating solution, the second wiring layer 230 is formed on the metal deposition layers 250, and the second pad 232 is formed in the slot 242 of the solid conductive pillar 240. The metal deposition layers 250, the second wiring layer 230, and the solid conductive pillar 240 fill up the intaglio pattern 214, in which the slot 242 and the second pad 232 fill up the recess 214a.

Components of the first chemical plating solution and the second chemical plating solution are different. Particularly, the second chemical plating solution may also be a liquid including metal ions, and types of the first chemical plating solution and the second chemical plating solution may be the same, but concentrations thereof are different. For example, the first chemical plating solution and the second chemical plating solution may be copper ion solutions in the same type but at different concentrations, such that the materials of the solid conductive pillar 240 and the second wiring layer 230 are the same. However, in this embodiment, even if the types of the first chemical plating solution and the second chemical plating solution are different, the materials of the solid conductive pillar 240 and the second wiring layer 230 may still be the same.

The first chemical plating solution is, for example, the copper sulfate solution, and the second chemical plating solution is, for example, the copper chloride solution or the copper nitrate solution. That is to say, types of anions of the first chemical plating solution and anions of the second chemical plating solution are different, but types of metal ions of the first chemical plating solution and the second chemical plating solution are the same. Therefore, although the solid conductive pillar 240 and the second wiring layer 230 are formed by using the first chemical plating solution and the second chemical plating solution in different types, the solid conductive pillar 240 and the second wiring layer 230 may be the same conductor material, for example, the copper material.

In addition, no matter the first chemical plating solution and the second chemical plating solution are the liquids in the same or different types, the first chemical plating solution and the second chemical plating solution may include a inhibitor, in which a concentration of the inhibitor of the first chemical plating solution is higher than a concentration of the inhibitor of the second chemical plating solution. The inhibitor may reduce a deposition rate of a product generated after the reaction in the recess 214a and the trenches 214b, and assists the product to fill up the blind via T2.

Particularly, the inhibitor has a great amount of high molecular groups, and the high molecular groups have polar ends, and are easily deposited on the upper surface 212a of the activating insulation layer 210, but not easily enter the blind via T2, the recess 214a, and the trenches 214b. The higher the concentration of the inhibitor is, the slower the deposition rate of the product in the recess 214a and the trenches 214b is, and the better the capability for filling the blind via T2 is. Therefore, when the activating insulation layer 210 is dipped in the first chemical plating solution, the product fills up the blind via T2, so as to form the solid column 244 and the slot 242, and form the metal deposition layers 250 not filling up the intaglio pattern 214.

Figure 3A:
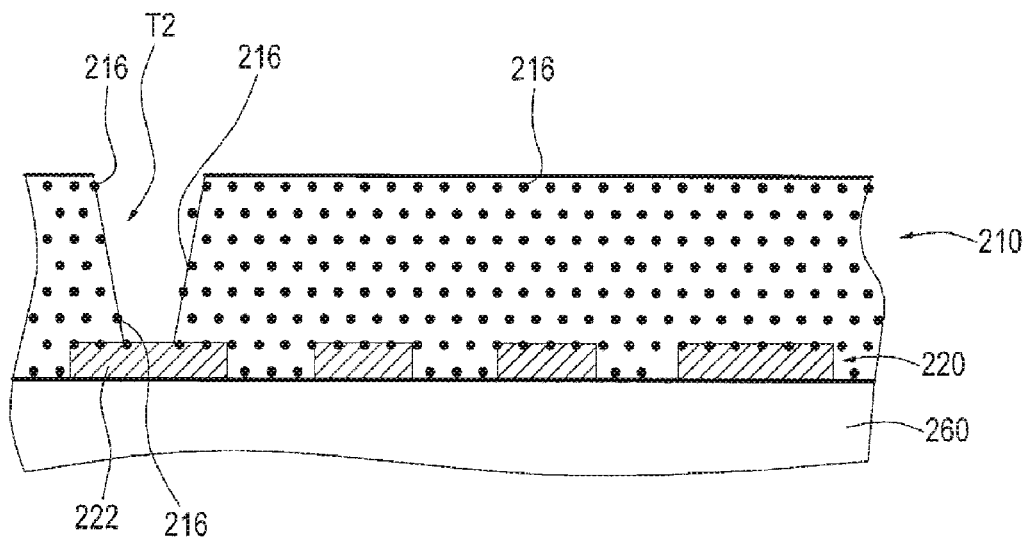
FIGS. 3A to 3E are cross-sectional views of a process of a method for manufacturing a embedded wiring board according to another embodiment of the present invention.
Figure 3B:
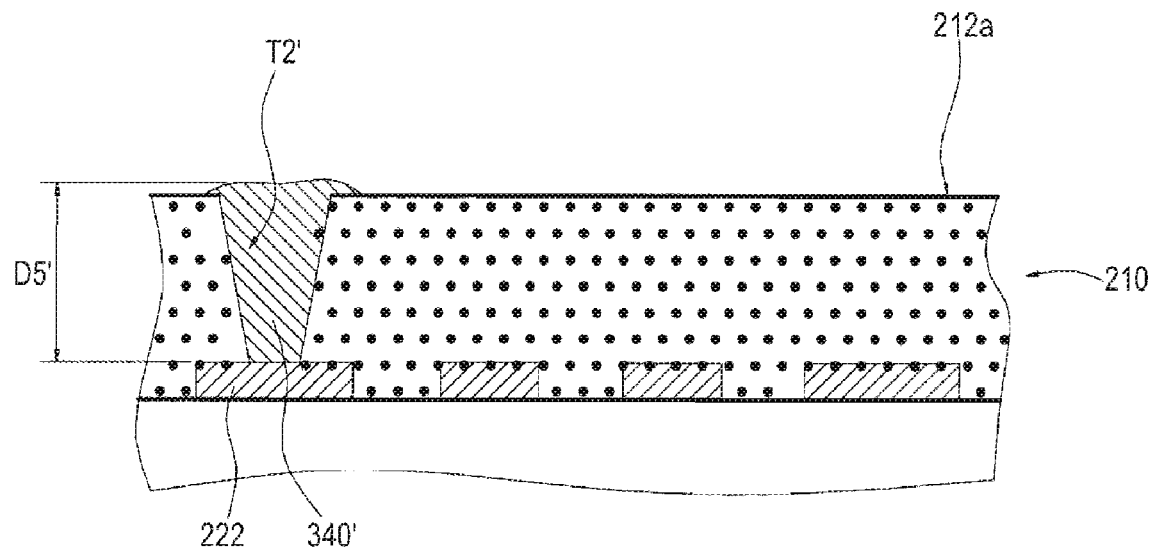
Figure 3C:
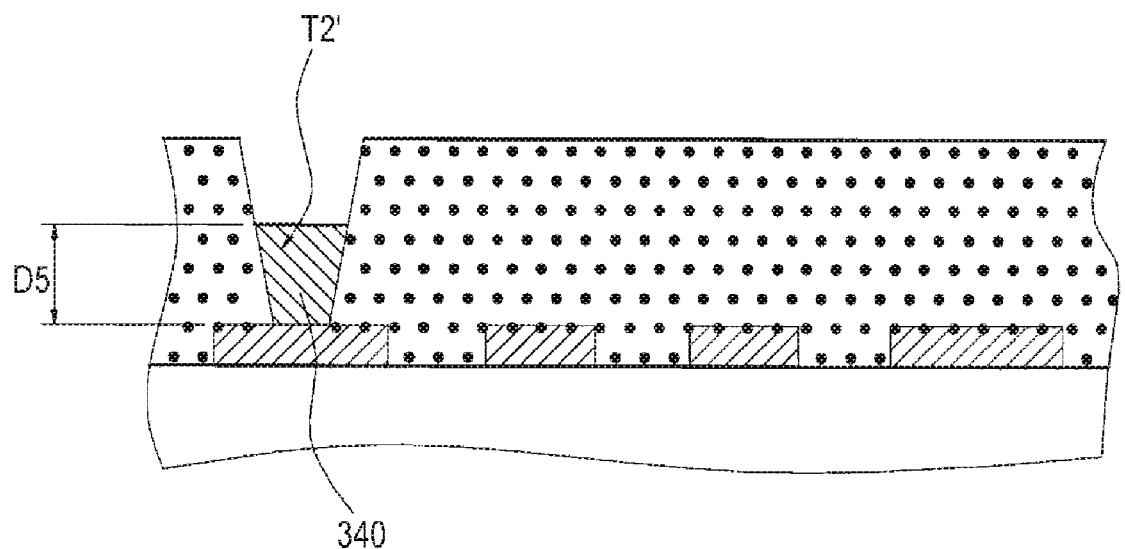
Figure 3D:
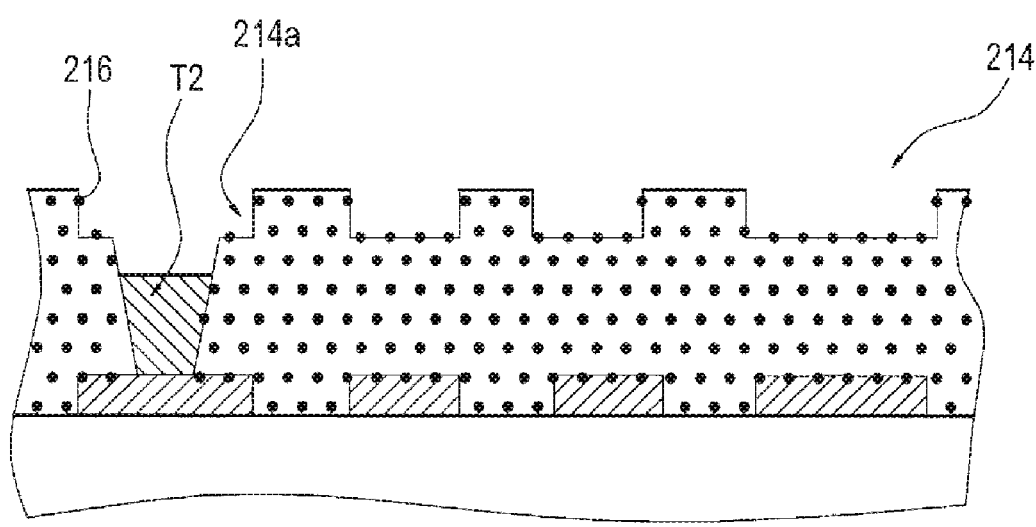
Figure 3E:
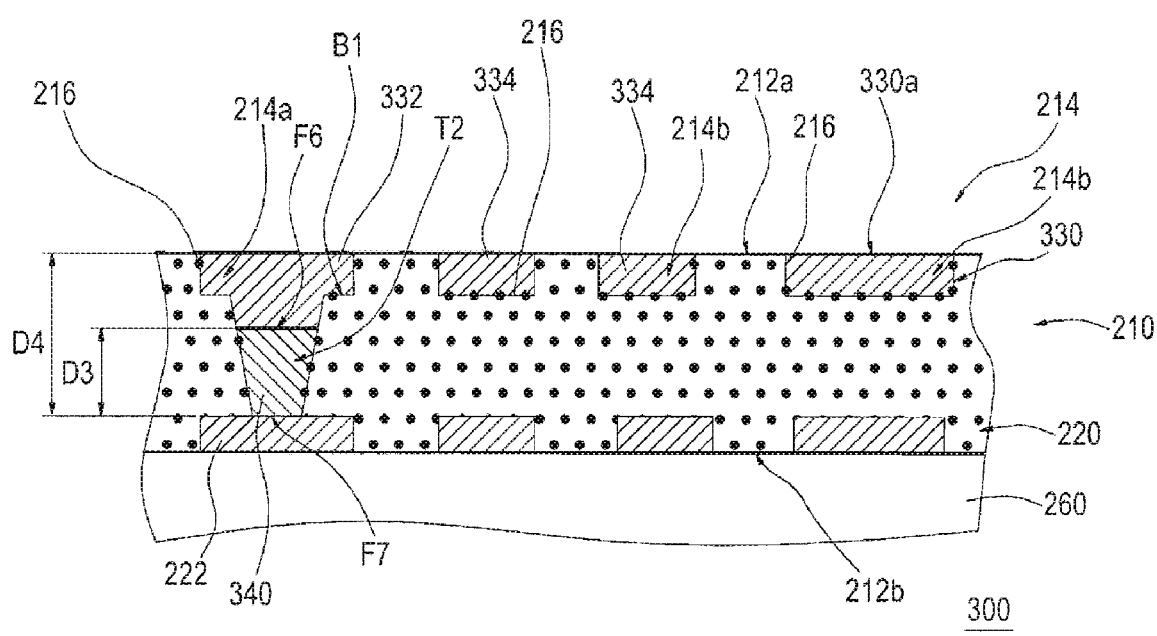

FIGS. 3A to 3E are cross-sectional views of a process of a method for manufacturing an embedded wiring board according to another embodiment of the present invention. Referring to FIG. 3E, firstly, a structure of the embedded wiring board 300 of this embodiment is introduced, and the embedded wiring board 300 is similar to the embedded wiring board 200 of the above embodiment, so only structural differences between the two are introduced as follows.

The embedded wiring board 300 includes an activating insulation layer 210, a first wiring layer 220, an inner layer wiring substrate 260, a second wiring layer 330, and a solid conductive pillar 340. Relative relations, connection relations, and structures of the activating insulation layer 210, the first wiring layer 220, and the inner layer wiring substrate 260 are the same as those of the above embodiment, and are disclosed in the content of the above embodiment, so they are not described again here.

The embedded wiring board 300 may be a multilayer wiring board or a double-side wiring board, and when the embedded wiring board 300 is the double-side wiring board, the embedded wiring board 300 does not need the inner layer wiring substrate 260, that is, the embedded wiring board 300 may not include the inner layer wiring substrate 260. Therefore, the inner layer wiring substrate 260 shown in FIG. 3E is only used for exemplary description, but is not used to limit the present invention.

The structural differences between the embedded wiring board 300 and 200 are as follows. The second wiring layer 330 and the solid conductive pillar 340 of this embodiment are different from the second wiring layer 230 and the solid conductive pillar 240 of the above embodiment, the embedded wiring board 300 does not include the metal deposition layers 250, and the second wiring layer 330 contacts with some catalyst particles 216 of the activating insulation layer 210.

The second wiring layer 330 includes at least one second pad 332 and a plurality of traces 334, and the second pad 332 and the traces 334 are buried in an upper surface 212a of the activating insulation layer 210. The activating insulation layer 210 has a blind via T2 and an intaglio pattern 214, and the second wiring layer 330 is located in the intaglio pattern 214, and contacts with the catalyst particles 216 in the intaglio pattern 214.

Particularly, the intaglio pattern 214 includes a recess 214a and trenches 214b. The second pad 332 is located in the recess 214a, and the traces 334 are respectively located in the trenches 214b. The second pad 332 and the traces 334 contact with some catalyst particles 216, as shown in FIG. 3E. In addition, a surface 330a of the second wiring layer 330 may be substantially aligned with the upper surface 212a.

The solid conductive pillar 340 is disposed in the activating insulation layer 210, and is further disposed in the blind via T2, and the second pad 332 is connected to the solid conductive pillar 340. An upper interface plane F6 exists between the solid conductive pillar 340 and the second pad 332, and a lower interface plane F7 exists between the solid conductive pillar 340 and the first pad 222. The upper interface plane F6 and the lower interface plane F7 may be observed by using an optical microscope.

The upper interface plane F6 separates the solid conductive pillar 340 and the second pad 332, and the lower interface plane F7 separates the solid conductive pillar 340 and the first pad 222. Therefore, the upper interface plane F6 may be considered as a boundary between the solid conductive pillar 340 and the second pad 332, and the lower interface plane F7 may be considered as a boundary between the solid conductive pillar 340 and the first pad 222.

In this embodiment, the upper interface plane F6 is located under a bottom surface B1 of the recess 214a, as shown in FIG. 3E. In addition, a distance D3 between the upper interface plane F6 and the first wiring layer 220 is smaller than a distance D4 between the upper surface 212a and the first wiring layer 220, and a ratio of the distance D3 to the distance D4 is between 50% and 90%, such that compared with the lower surface 212b, the upper surface 212a is closer to the upper interface plane F6.

Only the structure of the embedded wiring board 300 is introduced in the above. Next, the method for manufacturing the embedded wiring board 300 is described in detail with reference to FIGS. 3A to 3E. The method for manufacturing the embedded wiring board 300 is similar to the method for manufacturing the embedded wiring board 200 of the above embodiment, so only differences between the two are introduced in the following.

Referring to FIG. 3A, in the method for manufacturing the embedded wiring board 300, after the activating insulation layer 210 covering the first wiring layer 220 is formed, at least one blind via T2' is formed on the activating insulation layer 210. The blind via T2' partially exposes the first wiring layer 220, and particularly exposes the first pad 222 of the first wiring layer 220, and some catalyst particles 216 are activated and exposed in the blind via T2'.

The manner of forming the activating insulation layer 210 and the manner of activating the catalyst particles 216 are disclosed in the content of the above embodiment, and the manner of forming the blind via T2' is the same as the manner of forming the blind via T2 of the above embodiment, so the manners of forming the activating insulation layer 210 and the blind via T2', and the manner of activating the catalyst particles 216 are not described again here.

In addition, in this embodiment, the activating insulation layer 210 may be formed on the inner layer wiring substrate 260, but in other embodiments that are not shown herein, it is unnecessary to form the activating insulation layer 210 on the inner layer wiring substrate 260, so as to manufacture the embedded wiring board 300 of the double-side wiring board type. Therefore, the inner layer wiring substrate 260 shown in FIGS. 3A to 3E is only used for the exemplary description, but is not used to limit the present invention.

Referring to FIG. 3B, next, the activating insulation layer 210 is dipped in a first chemical plating solution (not shown), and a solid conductive pillar 340' is formed in the blind via T2' through electroless plating, in which the solid conductive pillar 340' fills up the blind via T2', and is connected to the first pad 222, and the solid conductive pillar 340' protrudes from the upper surface 212a of the activating insulation layer 210. In addition, first chemical plating solution of this embodiment is the same as the first chemical plating solution of the above embodiment, and is not described again here.

Referring to FIGS. 3B and 3C, after the solid conductive pillar 340' is formed, a height D5' of the solid conductive pillar 340' relative to the first wiring layer 220 is reduced, such that the height D5' is reduced to a height D5 (the height D5 is equal to the distance D3 as shown in FIG. 3E), and the solid conductive pillar 340 is formed. The solid conductive pillar 340 does not fill up the blind via T2', as shown in FIG. 3C. The height D5' is reduced to the height D5 by etching the solid conductive pillar 340', and the etching method may be wet etching.

Referring to FIGS. 3C and 3D, after the solid conductive pillar 340 is formed, the intaglio pattern 214 is formed, and the catalyst particles 216 exposed in the intaglio pattern 214 are activated. The recess 214a of the intaglio pattern 214 is formed on an opening of the blind via T2', such that a profile of the blind via T2' is changed to form the blind via T2, as shown in FIG. 3D, in which the blind via T2 is located under the recess 214a. The intaglio pattern 214 is formed and the catalyst particles 216 exposed in the intaglio pattern 214 are activated in the same manner as that in the above embodiment, so it is not described again here.

Referring to FIG. 3E, then, the activating insulation layer 210 is dipped in a second chemical plating solution (not shown), and the second wiring layer 330 is formed in the intaglio pattern 214 through the electroless plating. Till now, the embedded wiring board 300 is basically manufactured.

In this embodiment, components of the second chemical plating solution and the first chemical plating solution are different, for example, a concentration of an inhibitor of the first chemical plating solution is higher than a concentration of an inhibitor of the second chemical plating solution. In addition, the second chemical plating solution of this embodiment is the same as the second chemical plating solution of the above embodiment, so it is not described again here.

The second chemical plating solution directly has a chemical reaction (for example, an oxidation and reduction reaction) with the activated catalyst particles 216, such that a metal is deposited in the intaglio pattern 214 and the blind via T2, so as to form the second wiring layer 330. When the second wiring layer 330 is formed, the metal is deposited in the blind via T2, so a part of the second pad 332 extends into the blind via T2, and is connected to the solid conductive pillar 340, such that the upper interface plane F6 is formed under the bottom surface B1 of the recess 214a.

Based on the above, the method for manufacturing the embedded wiring board 300 of this embodiment is similar to that of the embedded wiring board 200 of the above embodiment, except that the intaglio pattern 214 of this embodiment is formed after the solid conductive pillar 340 is formed, and the intaglio pattern 214 of the above embodiment is formed before the solid conductive pillar 240 is formed. Next, the method for manufacturing the embedded wiring board 300 of this embodiment further includes reducing the height D5' of the solid conductive pillar 340' relative to the first wiring layer 220, as shown in FIGS. 3B and 3C.

Figure 4A:
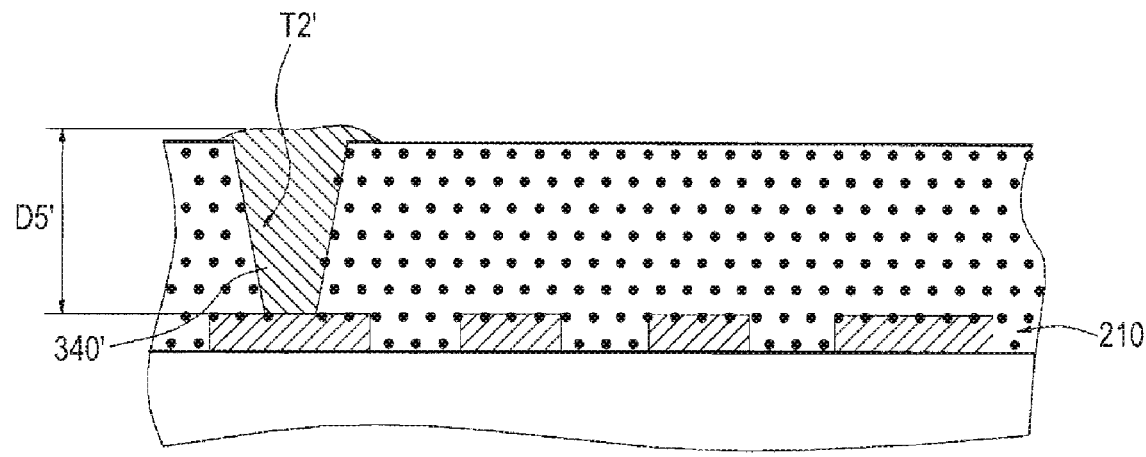
FIGS. 4A to 4C are cross-sectional views of a process of a method for manufacturing an embedded wiring board according to still another embodiment of the present invention.
Figure 4B:
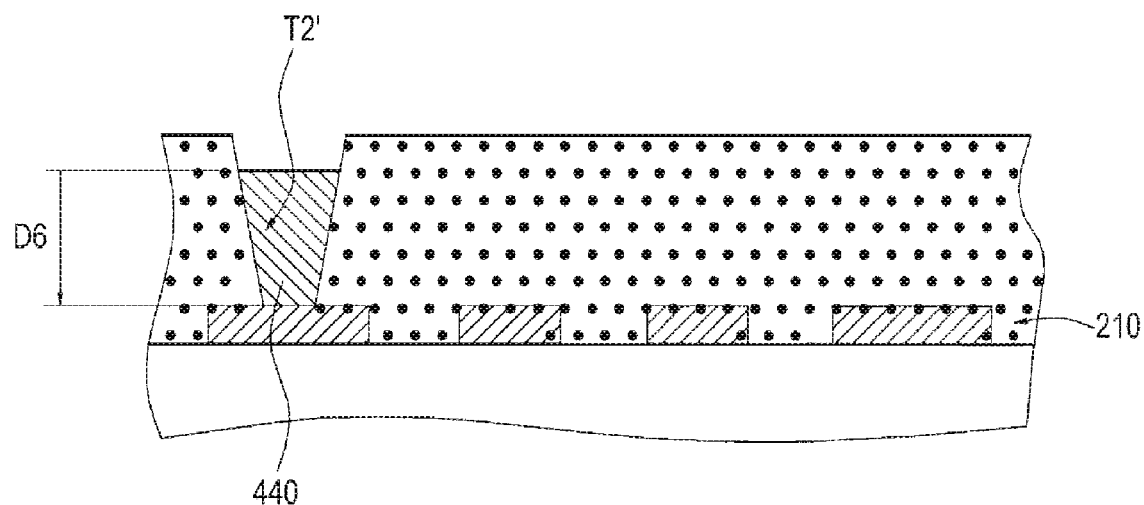
Figure 4C:
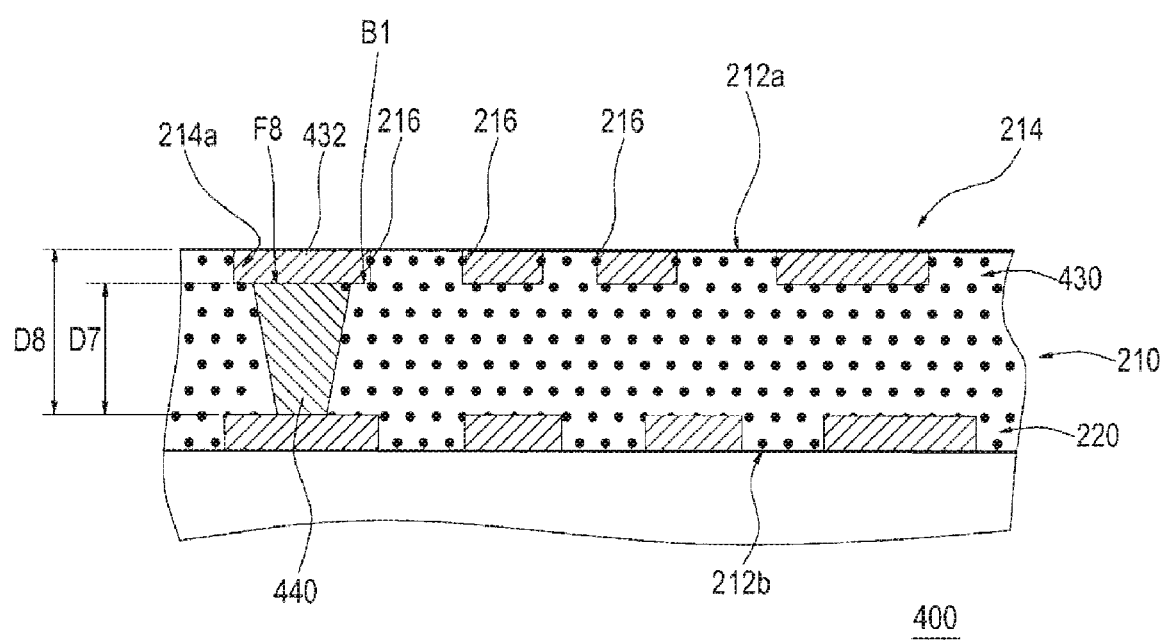

FIGS. 4A to 4C are cross-sectional views of a process of a method for manufacturing an embedded wiring board according to still another embodiment of the present invention. The method for manufacturing the embedded wiring board 400 and a structure of the embedded wiring board 400 of this embodiment are similar to the method for manufacturing the embedded wiring board 300 and the structure of the embedded wiring board 300 of the above embodiment, so FIGS. 4A to 4C only show a difference between the two. In the following, only the difference between the embedded wiring boards 400 and 300 is described in detail with reference to FIGS. 4A to 4C.

Referring to FIG. 4C, for the structure, the embedded wiring board 400 includes a solid conductive pillar 440, a first wiring layer 220, a second wiring layer 430, and an activating insulation layer 210. The second wiring layer 430 includes at least one second pad 432 connected to the solid conductive pillar 440, and an upper interface plane F8 exists between the solid conductive pillar 440 and the second pad 432. A distance D7 between the upper interface plane F8 and the first wiring layer 220 is smaller than a distance D8 between the upper surface 212a and the first wiring layer 220, and a ratio of the distance D7 to the distance D8 is between 50% and 90%. In addition, the upper interface plane F8 may be o by using an optical microscope.

It may be known that for the structure, the main difference between the embedded wiring board 400 of this embodiment and the embedded wiring board 300 of the above embodiment is that the upper interface plane F8 is aligned with a bottom surface B1 of the recess 214a, as shown in FIG. 4C, and other structural features are basically the same as the embedded wiring board 300, so they are not described here.

Referring to FIGS. 4A and 4B, in the method for manufacturing the embedded wiring board 400 of this embodiment, after the solid conductive pillar 340' is formed in the blind via T2', a height D5' of the solid conductive pillar 340' relative to the first wiring layer 220 is reduced, so as to form the solid conductive pillar 440. The height D5' is reduced to a height D6 (as shown in FIG. 4B, the height D6 is equal to a distance D7 as shown in FIG. 4C). The height D6 is greater than the height D5 as shown in FIG. 3C. That is, the height D5' of the solid conductive pillar 340' of this embodiment is reduced by the amplitude smaller than the height D5' of the solid conductive pillar 340' of the above embodiment is.

Referring to FIGS. 4B and 4C, after the height D5' is reduced to the height D6, the processes for forming the intaglio pattern 214, activating the catalyst particles 216, and forming the second wiring layer 430 are performed in sequence, so as to form the embedded wiring board 400. The process for forming the intaglio pattern 214 and the second wiring layer 430, and the process for activating the catalyst particles 216 are disclosed in the above embodiment and FIGS. 3D to 3E, so they are not described again here.

To sum up, in the present invention, through the activating insulation layer including the plurality of catalyst particles and the two chemical plating solutions having different components (that is, the first chemical plating solution and the second chemical plating solution), a wiring layer (that is, the second wiring layer) and at least one solid conductive pillar are formed in the intaglio pattern and the blind hold through electroless plating. That is to say, in the present invention, the wiring layer and the solid conductive pillar are formed under a condition of not applying any external current. Therefore, in the present invention, the electrical energy required for manufacturing the embedded wiring board is reduced, so as to reduce the energy consumption, which satisfies the environmental demand for saving the energy.

Next, the activated catalyst particles directly has the chemical reaction (for example, a chemical displacement reaction and/or oxidation and reduction reaction) with the first chemical plating solution and the second chemical plating solution to deposit the metal, so as to form the second wiring layer and the solid conductive pillar. Compared with the prior art, in the present invention, the solid conductive pillar and the second wiring layer are formed by using the activated catalyst particles without forming the seed layer in advance. Compared with the prior art, the present invention does not need the process for forming the seed layer, and the material cost required for forming the seed layer is saved.

Further, in the present invention, the solid conductive pillar is formed through the electroless plating, such that at least one wiring layer may be added to the embedded wiring board of the present invention, and one or more conductive columns may be stacked above the solid conductive pillar. In this manner, in the present invention, not only a wiring board having a stack-via structure, but also a wiring board having a stagger-via structure, can be formed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An embedded wiring board, comprising:
    an activating insulation layer having an upper surface and a lower surface opposite to the upper surface, comprising a plurality of catalyst particles substantially evenly distributed in a high molecular weight compound;
    a first wiring layer located on the lower surface of the activating insulating layer, comprising at least one first pad exposedly embedded in the lower surface;
    a second wiring layer located on the upper surface, comprising at least one second pad exposedly embedded in the upper surface; and
    a solid conductive pillar disposed in the activating insulation layer in contact with some of the catalyst particles, and connected between the first pad and the second pad, wherein an upper interface plane exists between the solid conductive pillar and the second pad, the upper interface plane separates the solid conductive pillar and the second pad, and a distance between the upper interface plane and the upper surface is not greater than a distance between the upper interface plane and the lower surface.

2. The embedded wiring board according to claim 1, wherein a ratio of a distance between the upper interface plane and the first wiring layer to a distance between the upper surface and the first wiring layer is between 50% and 90%.

3. The embedded wiring board according to claim 1, wherein a lower interface plane exists between the solid conductive pillar and the first pad.

4. The embedded wiring board according to claim 1, further comprising an inner layer wiring substrate, wherein the activating insulation layer and the first wiring layer are disposed on the inner layer wiring substrate, and the first wiring layer is electrically connected to the inner layer wiring substrate.

5. The embedded wiring board according to claim 1, wherein the activating insulation layer has an intaglio pattern located on the upper surface, the second wiring layer is located in the intaglio pattern, the intaglio pattern comprises at least one recess, the second pad is located in the recess, the activating insulation layer further has a blind via located under the recess, the solid conductive pillar is disposed in the blind via, and the upper interface plane is located above a bottom surface of the recess.

6. The embedded wiring board according to claim 5, wherein a width of the upper interface plane is greater than an aperture of the blind via.

7. The embedded wiring board according to claim 5, wherein the solid conductive pillar comprises a slot and a solid column connected to the slot, the slot is located in the recess, the solid column is located in the blind via, and the second pad is located in the slot.

8. The embedded wiring board according to claim 7, wherein the slot and the solid column are integrally formed as a single-body structure.

9. The embedded wiring board according to claim 5, wherein the second pad contacts with other of the catalyst particles.

10. The embedded wiring board according to claim 9, wherein the upper interface plane is located under the bottom surface of the recess, and a ratio of a distance between the upper interface plane and the first wiring layer to a distance between the upper surface (212*a*) and the first wiring layer is between 50% and 90%.

11. The embedded wiring board according to claim 9, wherein the upper interface plane is aligned with the bottom surface of the recess.

* * * * *